United States Patent
Takano

(10) Patent No.: US 10,147,669 B2
(45) Date of Patent: Dec. 4, 2018

(54) COOLER

(71) Applicant: TOYOTA JIDOSHA KABUSHIKI KAISHA, Toyota-shi, Aichi-ken (JP)

(72) Inventor: Yuya Takano, Nishio (JP)

(73) Assignee: TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 38 days.

(21) Appl. No.: 15/102,732

(22) PCT Filed: Nov. 26, 2014

(86) PCT No.: PCT/IB2014/002568
§ 371 (c)(1),
(2) Date: Jun. 8, 2016

(87) PCT Pub. No.: WO2015/087121
PCT Pub. Date: Jun. 18, 2015

(65) Prior Publication Data
US 2016/0365301 A1 Dec. 15, 2016

(30) Foreign Application Priority Data
Dec. 11, 2013 (JP) .................................. 2013-256059

(51) Int. Cl.
*F28F 25/06* (2006.01)
*H01L 23/473* (2006.01)
(Continued)

(52) U.S. Cl.
CPC .......... *H01L 23/4735* (2013.01); *F28F 25/06* (2013.01); *H01L 23/4336* (2013.01);
(Continued)

(58) Field of Classification Search
CPC ... H01L 23/4735; H01L 23/4336; F28F 25/06
(Continued)

(56) References Cited

U.S. PATENT DOCUMENTS 4,108,242 A * 8/1978 Searight .................... F28D 9/00
165/164
4,750,086 A * 6/1988 Mittal ................. H01L 23/4332
165/908
(Continued)

FOREIGN PATENT DOCUMENTS

JP 06-252300 A 9/1994
JP 07-066339 A 3/1995
(Continued)

OTHER PUBLICATIONS

JP 2011166113 A Machine Translation English—Retrieved Sep. 2017.*
JP 2007165582 A Machine Translation English—Retrieved Sep. 2017.*

*Primary Examiner* — Len Tran
*Assistant Examiner* — Jenna M Hopkins
(74) *Attorney, Agent, or Firm* — Sughrue Mion, PLLC

(57) ABSTRACT

A cooler includes: a fin having a coolant inflow port; and a nozzle configured to eject the supplied coolant toward the coolant inflow port. The nozzle includes a flow passage wall, a tip end, a pressure receiving portion and a deformation portion. The tip end provides a coolant supply hole that ejects the coolant flowing through the flow passage. The pressure receiving portion is configured to be provided between the flow passage wall and the coolant supply hole, and to receive force in an ejection direction of the coolant. The deformation portion is configured to be provided either of between the flow passage wall and the pressure receiving portion and in the pressure receiving portion, and to displace the coolant supply hole in the ejection direction of the coolant in response to the force in the ejection direction of the coolant, the force being received by the pressure receiving portion.

10 Claims, 10 Drawing Sheets

(51) Int. Cl.
*H01L 23/467* (2006.01)
*H01L 23/433* (2006.01)

(52) U.S. Cl.
CPC .......... *H01L 23/467* (2013.01); *H01L 23/473* (2013.01); *H01L 2924/0002* (2013.01)

(58) Field of Classification Search
USPC ................ 165/908; 257/E23.1, E23.093; 239/533.13, 533.14, 602
See application file for complete search history.

(56) References Cited

U.S. PATENT DOCUMENTS

| | | | | |
|---|---|---|---|---|
| 5,183,104 A | * | 2/1993 | Novotny | H01L 23/467 165/104.33 |
| 5,249,358 A | * | 10/1993 | Tousignant | C25D 1/02 165/908 |
| 5,294,830 A | * | 3/1994 | Young | H01L 23/4338 165/80.4 |
| 5,365,400 A | * | 11/1994 | Ashiwake | H01L 23/433 165/80.4 |
| 5,854,092 A | * | 12/1998 | Root | H01L 23/4735 438/106 |
| 5,992,769 A | * | 11/1999 | Wise | A61M 5/32 239/135 |
| 6,431,260 B1 | * | 8/2002 | Agonafer | H01L 23/4735 165/80.4 |
| 7,362,574 B2 | * | 4/2008 | Campbell | H01L 23/4735 361/699 |
| 8,199,505 B2 | * | 6/2012 | Dede | F28F 3/048 165/104.33 |
| 8,266,802 B2 | * | 9/2012 | Campbell | H01L 23/4735 165/80.3 |
| 8,464,781 B2 | * | 6/2013 | Kenny | F04B 17/00 165/104.33 |
| 9,131,631 B2 | * | 9/2015 | Joshi | G06F 1/20 |
| 2002/0062945 A1 | * | 5/2002 | Hocker | F01D 5/189 165/53 |
| 2002/0112498 A1 | * | 8/2002 | Bash | G06F 1/20 62/259.2 |
| 2003/0062426 A1 | * | 4/2003 | Gregory | B05B 1/185 239/107 |
| 2009/0090490 A1 | * | 4/2009 | Yoshida | H01L 23/4735 165/104.33 |
| 2012/0160459 A1 | * | 6/2012 | Flotta | H01L 23/4735 165/104.27 |
| 2012/0272521 A1 | * | 11/2012 | Lee | B21K 3/00 29/888.01 |
| 2013/0031914 A1 | * | 2/2013 | Lee | F01D 5/186 60/806 |
| 2014/0204532 A1 | * | 7/2014 | Mehring | H05K 7/20 361/689 |

FOREIGN PATENT DOCUMENTS

| | | | |
|---|---|---|---|
| JP | H0766339 A | * | 3/1995 |
| JP | 07-297584 A | | 11/1995 |
| JP | 2001-193127 A | | 7/2001 |
| JP | 2007-110025 A | | 4/2007 |
| JP | 2007165582 A | * | 6/2007 |
| JP | 2007-281163 A | | 10/2007 |
| JP | 2011-166113 A | | 8/2011 |
| JP | 2011166113 A | * | 8/2011 |
| JP | 2012060135 A | * | 3/2012 .............. F28F 3/048 |
| WO | WO 9738274 A1 | * | 10/1997 ......... H01L 23/4735 |

\* cited by examiner

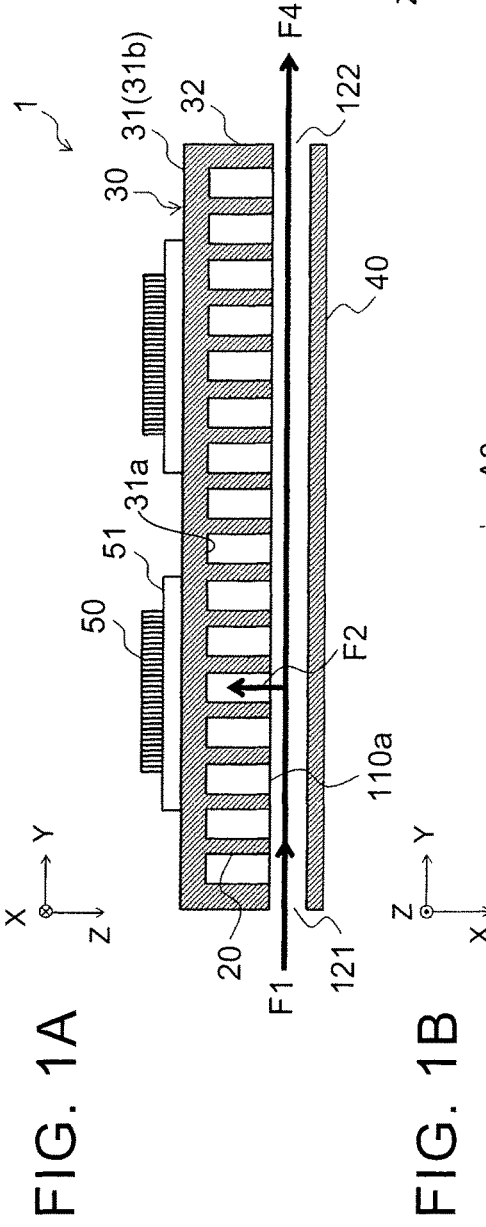
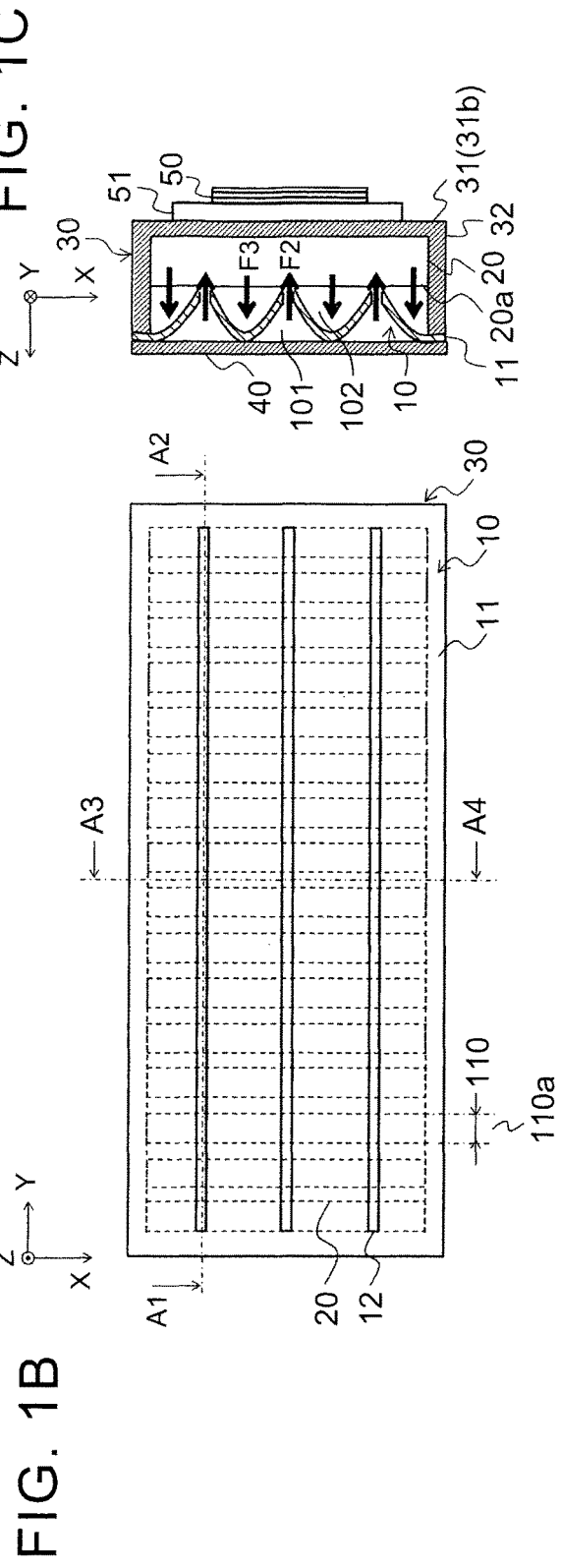
FIG. 1A
FIG. 1B
FIG. 1C

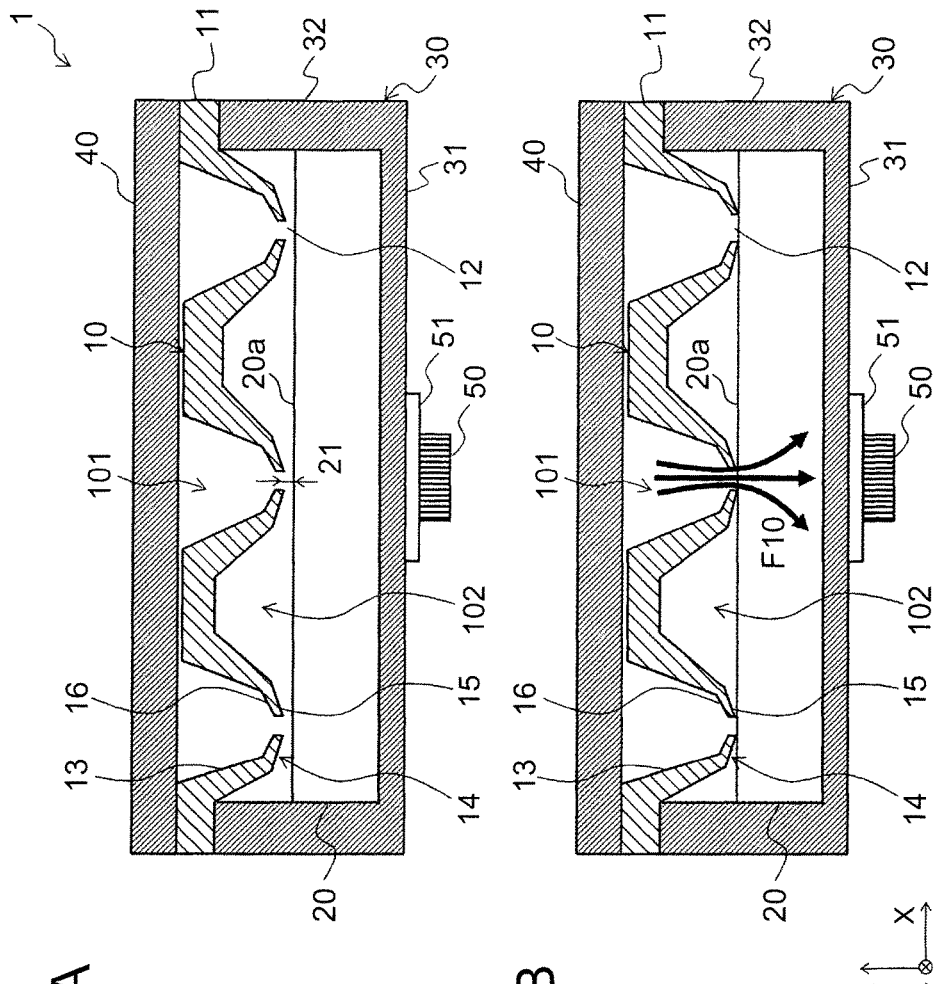

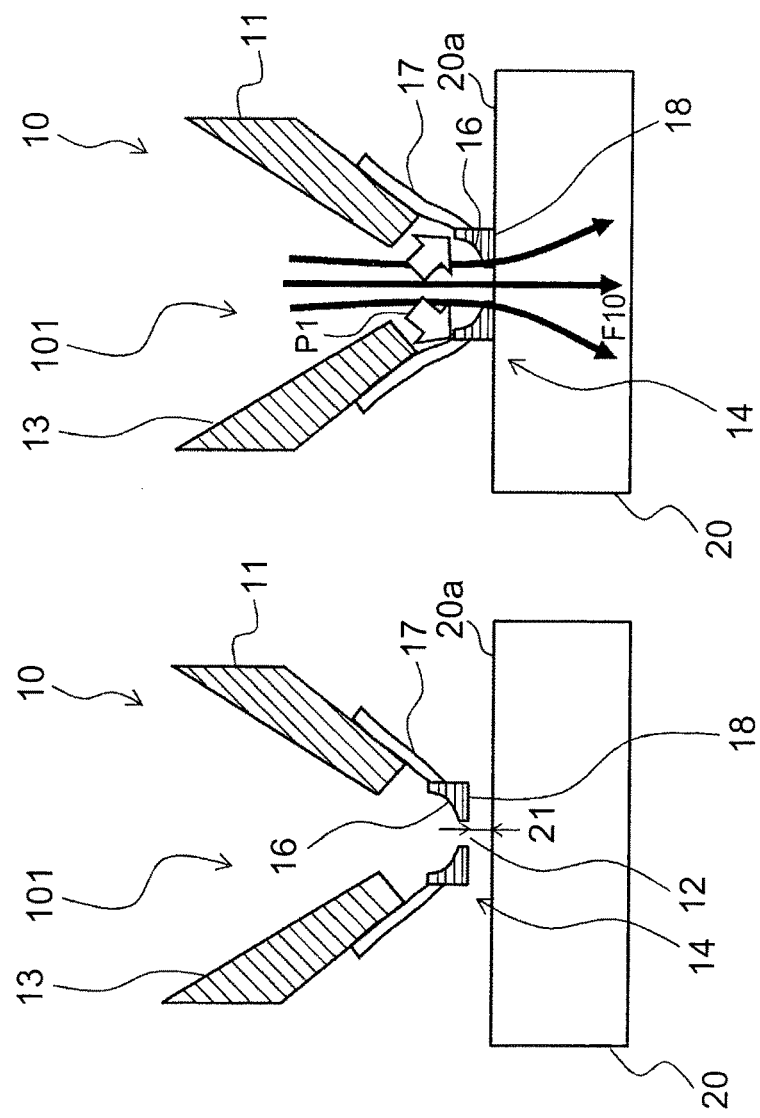

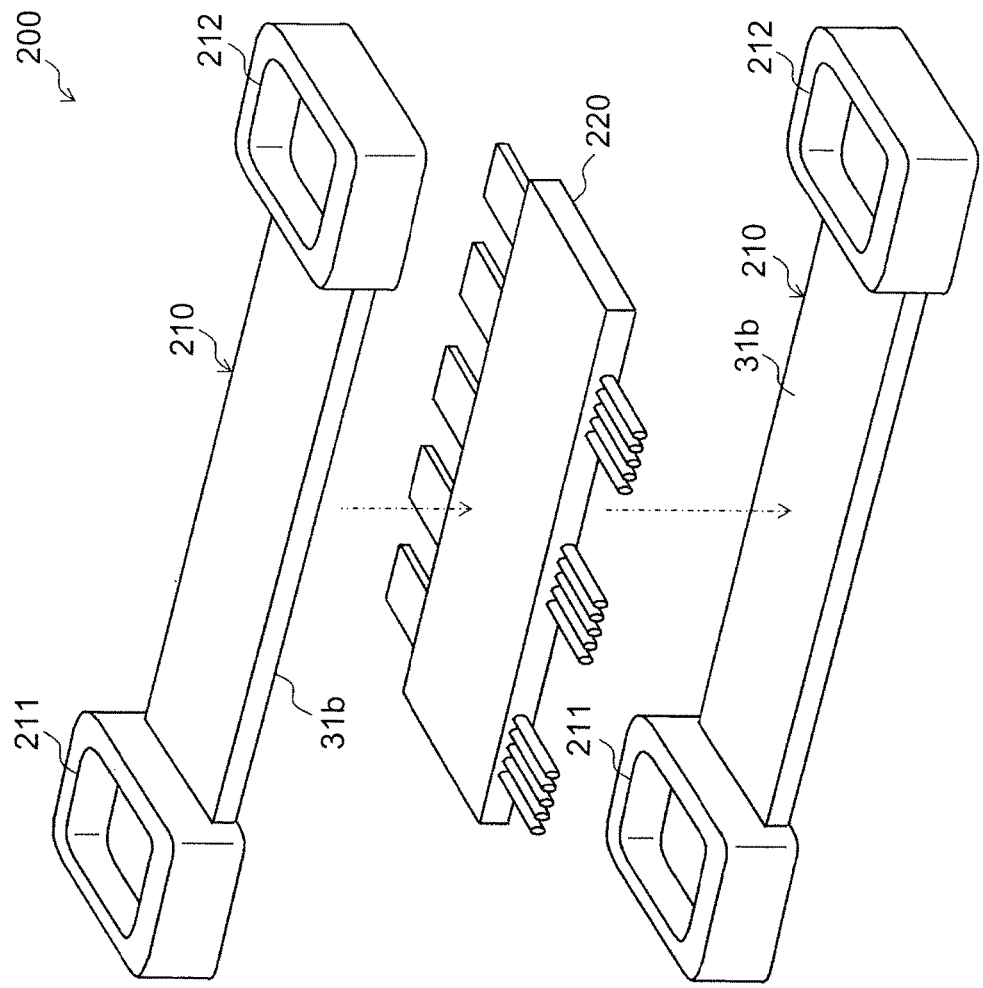

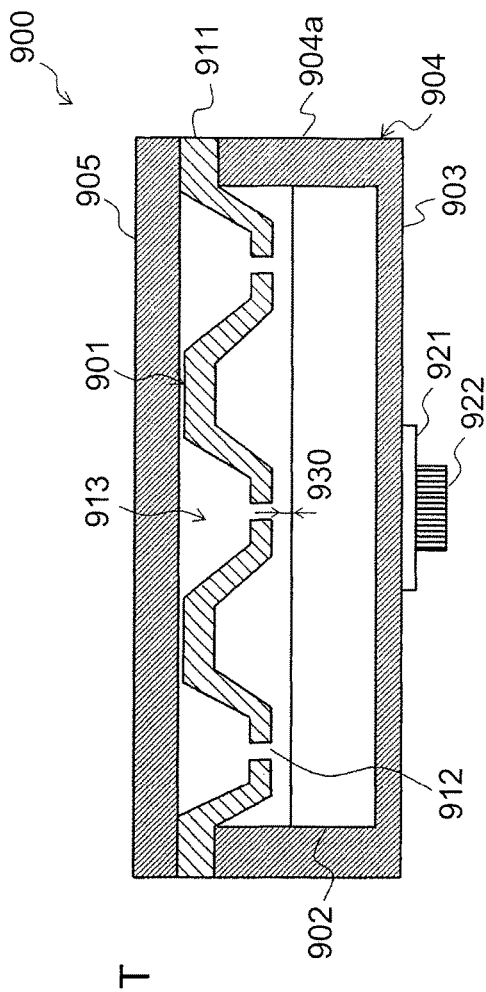
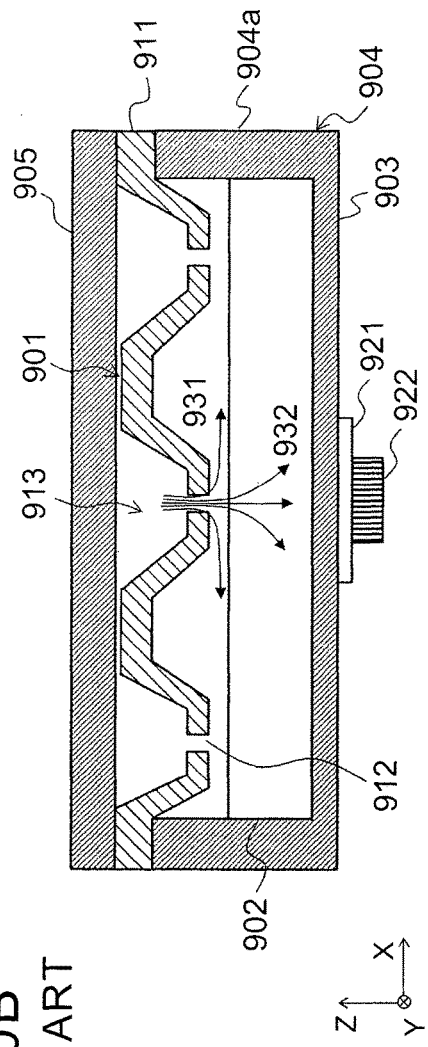
FIG. 10A
RELATED ART
FIG. 10B
RELATED ART

COOLER

BACKGROUND OF THE INVENTION

1. Field of the Invention

The invention relates to a cooler, and particularly, to a cooler that ejects coolant from nozzles to heat radiating fins.

2. Description of Related Art

In a hybrid automobile or the like, a power module is used, which includes a semiconductor device such as an inverter circuit that performs power conversion. In recent years, as such a power module has been downsized and an output thereof has been increased, generation of heat in the power module has become a large problem. Accordingly, a compact and high-performance cooler is desired, which effectively cools the heat generated in the power module or the like.

As a related art of such a cooler, for example, an impinging jet cooler described in Japanese Patent Application Publication No. 2011-166113 (JP 2011-166113 A) is known. The impinging jet cooler jets coolant from nozzles, and flows the coolant into fins, thereby cooling a heating element brought into contact with the fins.

FIG. 9 is a perspective view showing an internal configuration of the cooler according to the related art, which is described in Japanese Patent Application Publication No. 2011-166113 (JP 2011-166113 A). As shown in FIG. 9, the cooler 900 according to the related art includes: a base plate 903; a plurality of fins 902 arrayed on the base plate 903; and nozzles 901 which eject coolant to the plurality of fins 902. The nozzles 901 are composed of a nozzle member 911 formed into a wave shape, and coolant supply holes 912 are formed on fin 902-side apexes of the nozzle member 911. The coolant flows through inflow passages 913 formed of the nozzle member 911, and the coolant in the inflow passages 913 is ejected from the coolant supply holes 912 to regions between the fins 902, whereby a cooling target attached onto the base plate 903 is cooled.

FIGS. 10A and 10B are cross-sectional schematic views of the cooler of FIG. 9, which is according to the related art and is taken along a line A5-A6: FIG. 10A shows a state before the coolant is flown; and FIG. 10B shows a state at a time when the coolant is flown.

As shown in FIG. 10A, onto the base plate 903, a semiconductor device 922 is attached through an insulating layer 921, and the fins 902 are arrayed on a case body 904 that uses the base plate 903 as a bottom portion thereof. A case cover 905 is adhered onto an end portion of a base side wall 904a of the case body 904 through end portions of the nozzle member 911, and an inside of the cooler is hermetically sealed.

Here, in an actual cooler, dimensional tolerances are present in the respective components, which are the nozzle member 911, the fins 902 and the case body 904. If the inside of the cooler is attempted to be hermetically sealed as shown in FIG. 10A, for example, in a case where a height of the nozzles 901 is higher than a standard thereof owing to the tolerance, then a gap could occur between the end portion of the nozzle member 911 and an end portion of the case body 904.

However, it is necessary to completely hermetically seal a space between the nozzle member 911 and the case body 904 in order to prevent the coolant from leaking therefrom. Accordingly, in a case of setting a height of the nozzle member 911, for example, in consideration of the tolerances in order to give priority to the sealing between the nozzle member 911 and the case body 904, then a gap 930 could occur between tip ends of the nozzles and end portions of the fins as shown in FIG. 10A.

When the coolant is flown in this state, then as shown in FIG. 10B, the coolant leaks through the gap 930 as shown by arrows 931 even if the coolant in the inflow passage 913 is ejected from each of the coolant supply holes 912 toward the fins 902. Therefore, in the cooler according to the related art, the coolant, which should reach roots of the fins, leaks from the gap 930, and a velocity of jets ejected as shown by arrows 932 is lowered. Accordingly, the cooler according to the related art has a problem that cooling performance thereof is lowered.

SUMMARY OF THE INVENTION

In consideration of the above-described problem, in the present invention a cooler capable of suppressing the lowering of the ejected jets, and thereby capable of suppressing the lowering of the cooling performance is provided.

In this connection, in accordance with an aspect of the present invention, a cooler is provided, which includes a heat transfer member and a nozzle. The heat transfer member has a coolant inflow port into which coolant flows. The nozzle is configured to eject a supplied coolant toward the coolant inflow port. Then, the nozzle includes a flow passage wall, a tip end, a pressure receiving portion and a deformation portion. The flow passage wall includes a flow passage for the supplied coolant. The tip end includes an ejection port that ejects the coolant flowing through the flow pasage. The pressure receiving portion is provided between the flow passage wall and the ejection port, and the pressure receiving portion is configured to receive force in an ejection direction of the coolant. The deformation portion is provided either between the flow passage wall and the pressure receiving portion or in the pressure receiving portion, and the deformation portion is configured to displace the ejection port in the ejection direction of the coolant in response to the force in the ejection direction of the coolant, the force being received by the pressure receiving portion.

Moreover, in the cooler, rigidity of the deformation portion may be lower than rigidity of the flow passage wall.

Furthermore, in the cooler, a thickness of the deformation portion may be thinner than a thickness of the flow passage wall.

Moreover, in the cooler, the deformation portion may be made of a material lower in rigidity than the flow passage wall.

Furthermore, in the cooler, a thin portion that is locally thin may be provided in the tip end. Moreover, a plurality of the thin portions may be provided.

Moreover, in the cooler, the pressure receiving portion may have an inclined surface inclined such that a width of a vicinity of the ejection port is narrow from the flow passage wall toward the ejection port.

Furthermore, in the cooler, the pressure receiving portion may have a concave curved surface that receives the ejected coolant.

Moreover, in the cooler, the nozzle may include a tip end member, which serves as a second tip end having the concave curved surface, on a peripheral portion of the ejection port.

Furthermore, in the cooler, a peripheral portion of the ejection port may extend along a surface of the heat transfer member, here the surface is opposite to the ejection port.

Moreover, in the cooler, the heat transfer member having the coolant inflow port may be a radiating fin that cools a cooling target.

In accordance with the cooler with the configuration as described above, the pressure receiving portion receives the force in the ejection direction of the coolant, whereby the deformation portion is deformed, and the ejection port moves in the ejection direction of the coolant. As a result, the coolant is ejected from the nozzle at a position closer to the heat transfer member, and accordingly, the coolant can be sent into the heat transfer member more efficiently. Therefore, the cooling performance of the cooler can be suppressed from being lowered.

As described above, in accordance with the present invention, the cooler, which is capable of suppressing the lowering of the cooling performance, can be provided.

BRIEF DESCRIPTION OF THE DRAWINGS

Features, advantages, and technical and industrial significance of exemplary embodiments of the invention will be described below with reference to the accompanying drawings, in which like numerals denote like elements, and wherein:

FIG. 1A, FIG. 1B and FIG. 1C are cross-sectional views and a plan view, which show a configuration of a cooler according to Embodiment 1;

FIG. 3A and FIG. 3B are cross-sectional views showing states of the cooler according to Embodiment 1 before and when coolant is flown therethrough;

FIG. 7A, FIG. 7B and FIG. 7C are enlarged cross-sectional views showing states of a cooler according to Embodiment 4 before and when the coolant is flown therethrough;

FIG. 8 is an exploded perspective view showing a stacked cooler according to Embodiment 5;

FIG. 10A and FIG. 10B are cross-sectional views showing states of the cooler according to the related art before and when the coolant is flown therethrough.

DETAILED DESCRIPTION OF EMBODIMENTS

Figure 2:
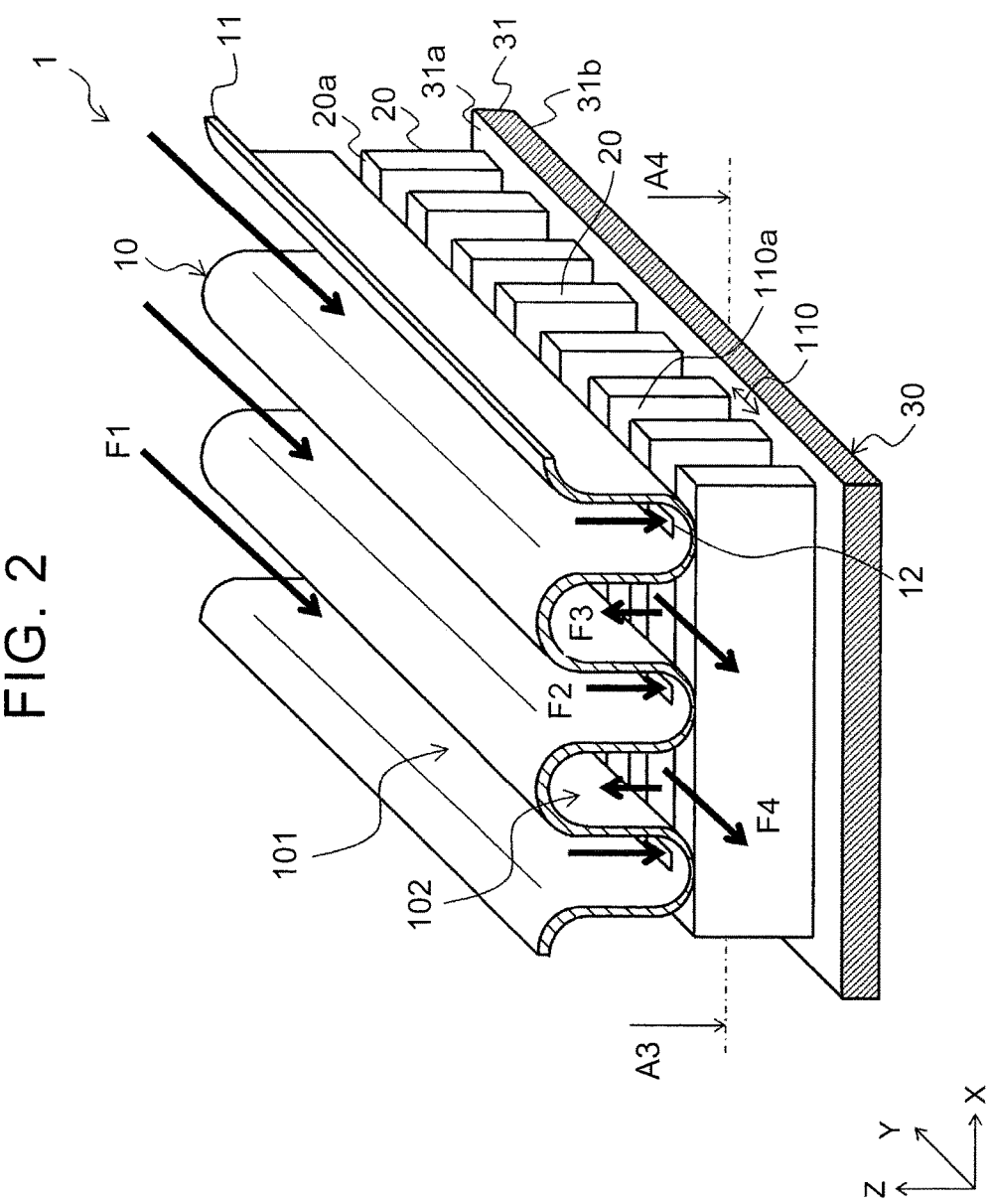
FIG. 2 is a cross-sectional view showing a configuration of the cooler according to Embodiment 1.

Embodiment 1 is described below with reference to the drawings. FIGS. 1A, 1B and 1C show a configuration of a cooler according to Embodiment 1. FIG. 1B is a plan view of the cooler viewed from a case cover side while removing a case cover therefrom, FIG. 1A is a cross-sectional view of the cooler in FIG. 1B, taken along a line A1-A2, and FIG. 1C is a cross-sectional view of the cooler in FIG. 1B, taken along a line A3-A4.

The cooler 1 according to this embodiment is an impinging jet cooler that flows coolant though an inside thereof, and ejects (jets) the flowing coolant from nozzles to fins, thereby cooling a cooling target. In the impinging jet cooler, a heat radiation area is increased by minute fins, and meanwhile, a large turbulence is generated by allowing jets of the coolant to impinge against the minute fins, whereby effective cooling is enabled. The cooler 1 according to this embodiment cools a semiconductor device as an example of the cooling target. For example, the semiconductor device is a step-up converter circuit, an alternating current/direct current inverter circuit or the like, and may be used for a power conversion circuit of a transmission/distribution facility or for a power supply circuit of a motor/generator for driving a vehicle. For the coolant, for example, a fluid such as water, ammonia and chlorofluorocarbon can be used.

As shown in FIG. 1A to FIG. 1C, the cooler 1 includes nozzles 10, fins 20, a case body 30, and a case cover 40. For example, the fins 20, the case body 30 and the case cover 40 are made of a highly thermally conductive material such as metal including aluminum and the like and such as ceramics.

The case body, 30 includes a substantially rectangular base plate 31, and a plate-like base side wall 32 provided on an outer periphery of the base plate 31. The base side wall 32 has openings on a part of the outer periphery of the base plate 31, for example, on two short side portions of the base plate 31, and forms an inlet 121 and outlet 122 of the coolant together with the base plate 31.

The fins (heat radiating fins) 20 are formed into a substantially rectangular plate shape, and are arranged such that two short sides of each thereof, which are opposite with each other, can contact the base side wall 32, and that one long side of each thereof can contact the base plate 31. On a fin arrangement surface 31a (inner surface of the case body 30) of the base plate 31, the fins 20 are arrayed at a predetermined interval in line in a thickness direction (Y-direction). Openings of inter-fin regions 110 between the fins 20 serve as coolant inflow ports 110a into which the coolant flows from the nozzles 10. In other words, it can be said that the fins 20 are, heat transfer members having the coolant inflow ports 110a. Note that the fins 20 may have other shapes such as that of corrugated fins bent into a wave shape.

Semiconductor devices 50 are attached onto a cooling surface 31b (outer surface of the case body 30) of the base plate 31, which is opposite with the fin arrangement surface 31a, through an insulating layer 51. Note that such cooling targets as the semiconductor devices 50 may be fixed to the base plate 31 without being through the insulating layer 51, or alternatively, the cooling targets may be formed integrally with the base plate 31 by being embedded therein.

The nozzles 10 are arranged in vicinities of ejection target surfaces 20a of the fins 20, which are located on an opposite side with the base plate 31. The nozzles 10 are composed of a plate-like nozzle member 11, and the nozzle member 11 is attached so as to cover an opening of a region surrounded by the base side wall 32. In the nozzle member 11, slit-like coolant supply holes (also referred to as ejection ports) 12 are formed, which are extended in an array direction (Y-direction) where the fins 20 are arrayed. A length of the coolant supply holes 12 is a length at which the openings cover (straddle) at least the inter-fin regions 110 (coolant inflow ports 110a) between the fins 20. In the example of FIGS. 1A, 1B and 1C, three coolant supply holes 12 are formed in parallel to one another; however, the number and length of the coolant supply holes 12 may be decided in response to a flow rate and cooling characteristics of the coolant. Since regions close to the coolant supply holes 12 are cooled efficiently, it is preferred that the semiconductor devices 50 be arranged on the cooling surface 31b of the case body 30, which is opposite to the coolant supply holes 12. For example, three semiconductor devices 50 may be arranged at positions individually corresponding to three coolant supply holes 12.

The nozzle member 11 is covered with the case cover 40 having the same shape as that of the base plate 31. The case cover 40 is attached to an end portion of the base side wall 32 through an end portion of the nozzle member 11, and hermetically seals an inside of the cooler. The case cover 40 may be only a planar plate, or alternatively, may have a side wall that surrounds an outer periphery of the planar plate.

FIG. 2 shows detailed configurations of the nozzle member 11, the fins 20 and the base plate 31. The nozzle member 11 is formed into the wave shape in a direction (X-direction) intersecting an array direction (Y-direction) where the fins 20 form a line, and is formed such that wavy concaves and convexes (valleys and mounts) can extend in the array direction of the fins 20. For example, the nozzle member 11 has the corrugated shape waving in such a concave-convex shape; however, besides this, may have a zigzag triangular wave shape or the like. Fin 20-side apexes of the nozzle member 11 are brought close to the ejection target surfaces 20a of the fins 20, and in the fin 20-side apexes (nozzle tip ends), the coolant supply holes 12 are formed along such an extending direction (Y-direction) of the concaves and the convexes. As described later, the nozzles 10 according to this embodiment include low-rigidity portions and pressure receiving portions on the nozzle tip ends.

Next, a description is made of a cooling operation, which is performed at a time of flowing the coolant through the cooler 1, by using FIGS. 1A, 1B and 1C and FIG. 2. First, as shown by arrows F1 in FIG. 1A and FIG. 2, the coolant is sent into the cooler 1 from the inlet 121, and flows through inflow passages 101 formed between the case cover 40 and the nozzle member 11. As shown by arrows F2 in FIG. 1A, FIG. 1C and FIG. 2, the coolant that flows through the inflow passages 101 is guided to the apexes of the valleys of the nozzle member 11, is then ejected from the coolant supply holes 12 to the inter-fin regions 110 (coolant inflow ports 110a), and becomes jets.

The ejected coolant acquires heat from the semiconductor devices 50 through the insulating layer 51, the base plate 31 and the fins 20. As shown by arrows F3 in FIG. 1C and FIG. 2, the coolant that has, impinged against the fin arrangement surface 31a of the base plate 31 is sent out to coolant discharge passages 102 formed of a surface of the nozzle member 11, which is opposite with the inflow passages 101, and of the base side wall 32. As shown by arrows F4 in FIG. 1A and FIG. 2, the coolant thus sent out passes through the coolant discharge passages 102, and is emitted from the outlet 122. As described above, the jets of the coolant impinge against roots of the fins, and pass along side surfaces of the fins, thereby taking away the heat of the semiconductor devices 50 to cool the same.

Figure 4A:
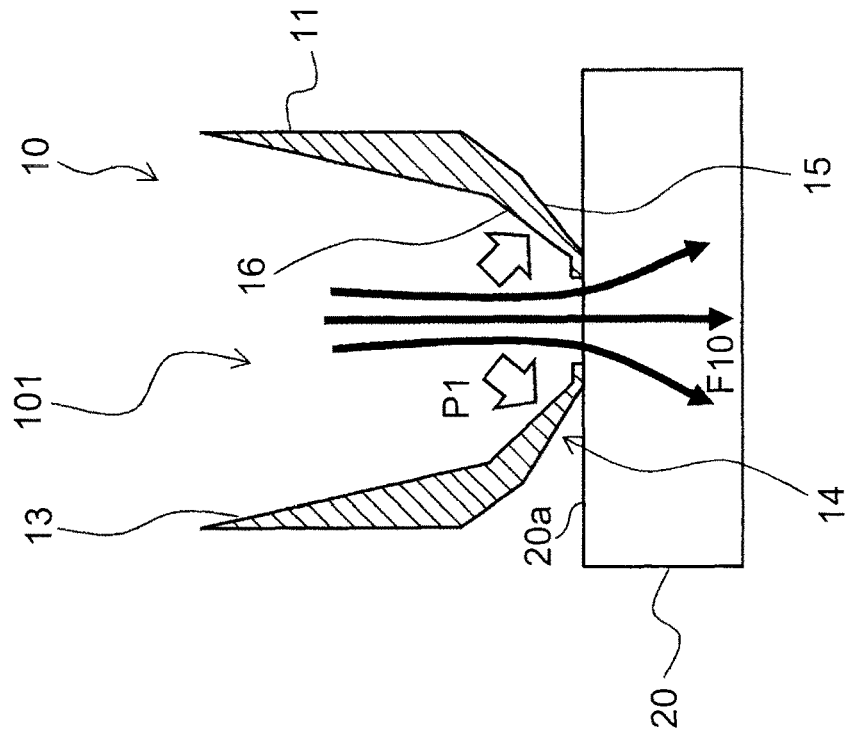
FIG. 4A and FIG. 4B are enlarged cross-sectional views showing the states of the cooler according to Embodiment 1 before and when the coolant is flown therethrough.
Figure 4B:
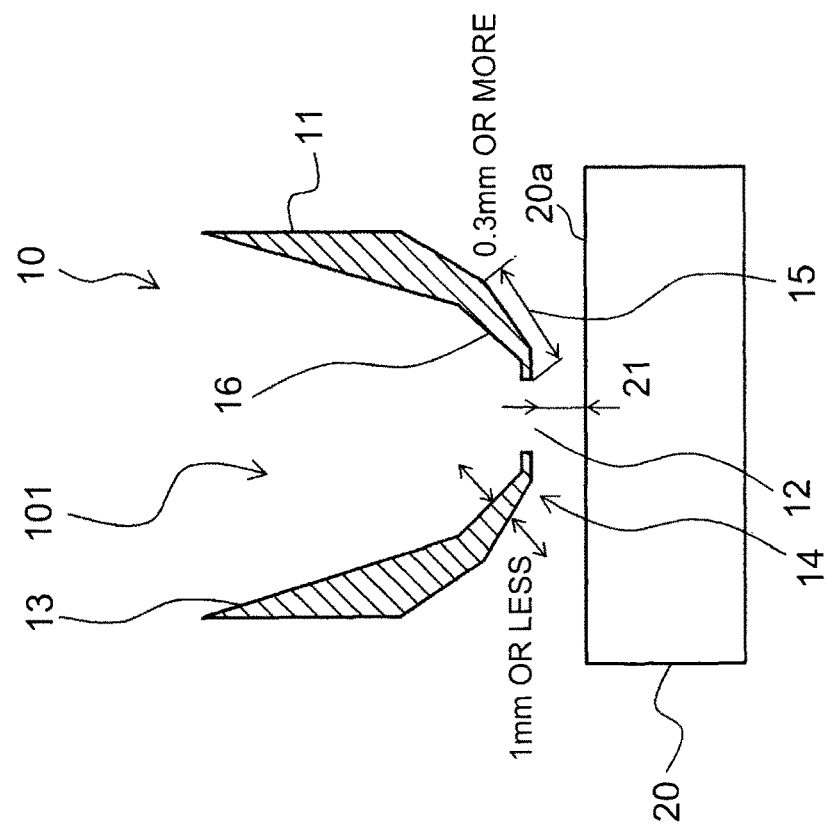

Moreover, a description is made of a configuration of the nozzles, which is a main feature in this embodiment. FIGS. 3A and 3B are cross-sectional views of the cooler 1, taken along the line A3-A4 in FIG. 1B and FIG. 2, and FIGS. 4A and 4B are enlarged cross-sectional Views of a vicinity of each of the nozzle tip ends in FIGS. 3A and 3B. FIG. 3A and FIG. 4A show a state of the cooler 1 before the coolant is flown therethrough, and FIG. 3B and FIG. 4B show a state of the cooler 1 when the coolant is flown therethrough.

As shown in FIG. 3A and FIG. 4A, the nozzle member 11 includes: flow passage walls 13 which form the inflow passages 101 and the coolant discharge passages 102; and nozzle tip ends 14 which are located more on a coolant supply hole 12 side than the flow passage walls 13 are. The nozzle member 11 is made of a resin or rubber material. In a case where the, nozzle member 11 is made of the resin material, then the resin material is, for example, PPS (Poly Phenylene Sulfide Resin) or the like, and in a case where the nozzle member 11 is made of the rubber material, the rubber material is, for example, nitrile rubber, silicon rubber or the like.

Moreover, each of the nozzle tip ends 14 includes: a thin portion 15 that serves as the low-rigidity portion lower in rigidity than the flow passage wall 13; and a pressure receiving portion 16 that receive force in an ejection direction (Z-direction) of the coolant. The thin portion 15 lowers the rigidity thereof by thinning a peripheral portion of each of the coolant supply holes 12 than the flow passage wall 13. The thin portion (low-rigidity portion) 15 is a deformation portion that displaces the coolant supply hole 12 to the fin 20 side in response to the force in the ejection direction of the coolant, which is received by the pressure receiving portion 16. For example, as shown in FIGS. 4A and 4B, the thin portion 15 has a thickness of 1 mm or less, and is a region with a length of 0.3 mm or more from an opening end of the coolant supply hole 12. In the example of FIGS. 4A and 4B, a region from a vicinity of the flow passage wall 13 to a vicinity of the coolant supply hole 12 is defined as the thin portion 15, and the thin portion 15 is formed so as to be thinned as approaching the coolant supply hole 12 from the flow passage wall 13 (note: in FIGS. 4A and 4B, since the flow passage wall 13 is partially illustrated while a part thereof is being omitted, an upper portion thereof is illustrated to be thinner; however, the upper portion is actually thicker. The same also applies to FIGS. 5A and 5B, FIGS. 6A and 6B and FIGS. 7A and 7B). Furthermore, an inflow passage 101-side surface of the nozzle tip end 14, which is located in the vicinity of the coolant supply hole 12, serves as the pressure receiving portion 16. In this embodiment, an inflow passage 101, side of the thin portion 15 serves as the pressure receiving portion 16. It can also be said that the thin portion 15 is formed on the pressure receiving portion 16. Since the pressure receiving portion 16 receives the force in the ejection direction of the coolant, the pressure receiving portion 16 is formed on an inclined surface, which is inclined such that a width thereof can be narrow from the flow passage wall 13 toward the coolant supply hole 12. Moreover, the peripheral portion of the coolant supply hole 12 is formed into a substantially linear shape along the ejection target surfaces 20a of the fins 20.

Before the coolant is flown, in a similar way to the illustration of the gap 930 in FIGS. 10A and 10B, dimensional tolerances are considered for the respective components, which are the nozzle member 11, the fins 20 and the case body 30, and a gap 21 occurs between the nozzle tip end 14 and each of the fins 20.

When the coolant, is flown in this state, force to eject the coolant from the coolant supply hole 12 is applied to' the pressure receiving portion 16 of the nozzle tip end 14 as shown in FIG. 3B and FIG. 4B (P1 in FIG. 4B). Since this pressure receiving portion 16 is the low-rigidity thin portion 15, the nozzle tip end 14 is pressed and deformed (displaced) in response to the force to eject the coolant (that is, reaction force of the jet). Then, the nozzle tip end 14 comes close to the fin 20, and intimately contacts the ejection target surface 20a of the fin 20. Since the nozzle tip end 14 and the ejection target surface 20a of the fin 20 come close to each other and intimately contact each other, the coolant is ejected to the fins 20 without leaking as shown by arrows F10 in FIG. 3B and FIG. 4B, and the jets circulate to the roots of the fins.

As described above, in this embodiment, in the impinging jet cooler, each of the nozzle tip ends is thinned to lower the rigidity thereof. In the cooler according to the related art, while the nozzle tip end has been capable of receiving the force from the coolant, the nozzle tip end has not been deformed by the force received from the coolant. In this embodiment, the nozzle tip end is formed as the low-rigidity portion, whereby the nozzle tip end is deformed upon receiving the force of the coolant in the ejection direction (that is, the reaction force of the coolant flow), and the nozzle tip end comes close to a fin end, and further, intimately contacts the fin end. Hence, at the time when the coolant is ejected, the gap between the nozzle tip end and the fin is small, and further, the gap is eliminated, whereby the flow rate of the jets can be suppressed from being lowered, and the cooling performance can be enhanced.

Next, Embodiment 2 is described. Embodiment 2 is similar to Embodiment 1 except the configuration of the nozzles.

Figure 5A:
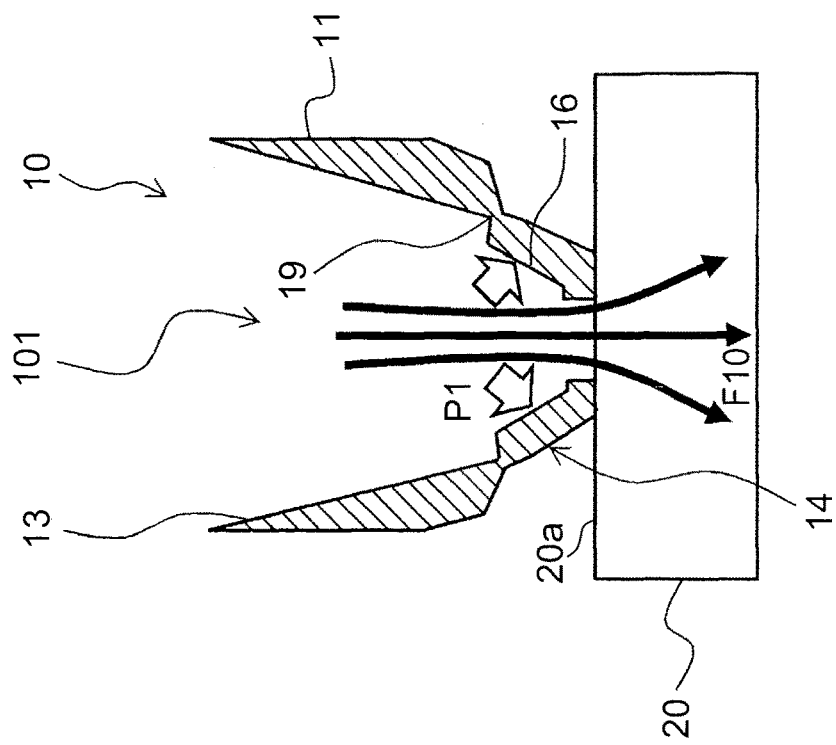
FIG. 5A and FIG. 5B are enlarged cross-sectional views showing states of a cooler according to Embodiment 2 before and when the coolant is flown therethrough.
Figure 5B:
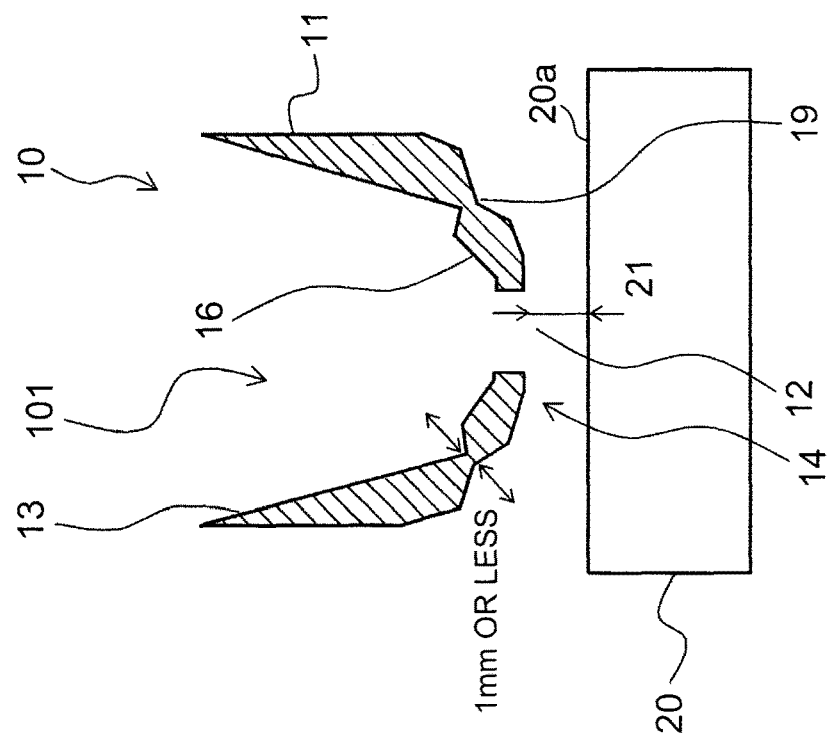

FIGS. 5A and 5B are enlarged cross-sectional views of a vicinity of each of nozzle tip ends of a cooler according to Embodiment 2. FIG. 5A shows a state of the nozzle 10 before the coolant is flown therethrough, and FIG. 5B shows a state of the nozzle 10 when the coolant is flown therethrough. In a similar way to Embodiment 1, a nozzle member 11 is made of the resin or rubber material.

In a similar way to FIGS. 4A and 4B, a nozzle tip end 14 includes: a locally thin portion 19; and a pressure receiving portion 16. In Embodiment 1, the region of the nozzle tip end 14, which has a length of 0.3 mm or more from the opening end, is defined as the thin portion, and meanwhile, in this embodiment, a part of the nozzle tip end 14 is locally defined as the thin portion 19 that has low rigidity. For example, the locally thin portion 19 has a thickness of 1 mm or less, and may be separated from the opening end by 0.3 mm or more. In this case, the locally thin portion 19 is thinner than a flow passage wall 13, and is thinner than a peripheral portion of a coolant supply hole 12 (note: in FIGS. 5A and 5B, since the flow passage wall 13 is partially illustrated, an upper portion thereof is illustrated to be thinner; however, the upper portion is actually thicker). Note that a plurality of the locally thin portions 19, which are locally defined, may be formed. Furthermore, an inflow passage 101-side surface of the nozzle tip end 14, which is located in the vicinity of the, coolant supply hole 12, serves as the pressure receiving portion 16. The pressure receiving portion 16 is formed between the locally thin portion 19 (low-rigidity portion) and the coolant supply hole 12. It can also be said that the locally thin portion 19 is formed between the pressure receiving portion 16 and the flow passage wall 13.

When the coolant is flown in this state, force to eject the coolant from the coolant supply hole 12 is applied to the pressure receiving portion 16 of the nozzle tip end 14 as shown in FIG. 5B (P1 in FIG. 5B). Since the locally thin portion 19, which has low rigidity, is formed between the pressure receiving portion 16 and the flow passage wall 13, the nozzle tip end 14 is pressed and deformed (displaced) about the locally thin portion 19 taken as an axis in response to the force to eject the coolant (that is, reaction force of the jet). Then, the nozzle tip end 14 comes close to the fin 20, and intimately contacts the ejection target surface 20a of the fin 20, and the coolant is ejected without leaking as shown by arrows F10 in FIG. 5B.

In Embodiment 2, a part of the nozzle tip end is formed as the locally thin portion, whereby the nozzle tip end and the fin end come close to each other and intimately contact each other in a similar way to Embodiment 1, and accordingly, the cooling performance can be enhanced. Moreover, a locally concave structure is given to the nozzle tip end, whereby the nozzle tip end can be made more deformable. For example, the plurality of local thin portions is formed, whereby the nozzle tip end can also be made far more deformable.

Next, Embodiment 3 is described. Embodiment 3 is similar to Embodiments 1 and 2 except the configuration of the nozzles.

Figure 6A:
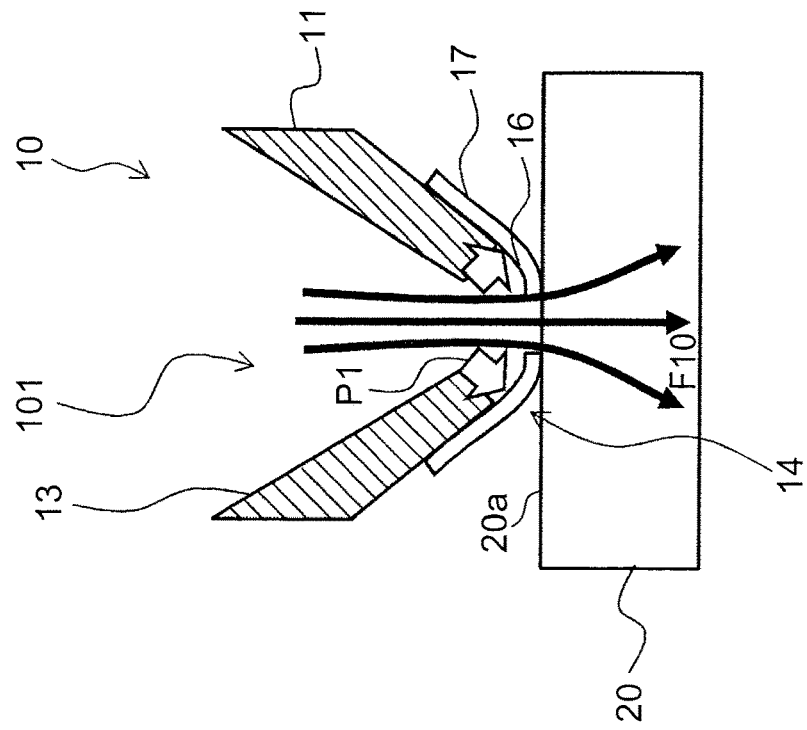
FIG. 6A and FIG. 6B are enlarged cross-sectional views showing states of a cooler according to Embodiment 3 before and when the coolant is flown therethrough.
Figure 6B:
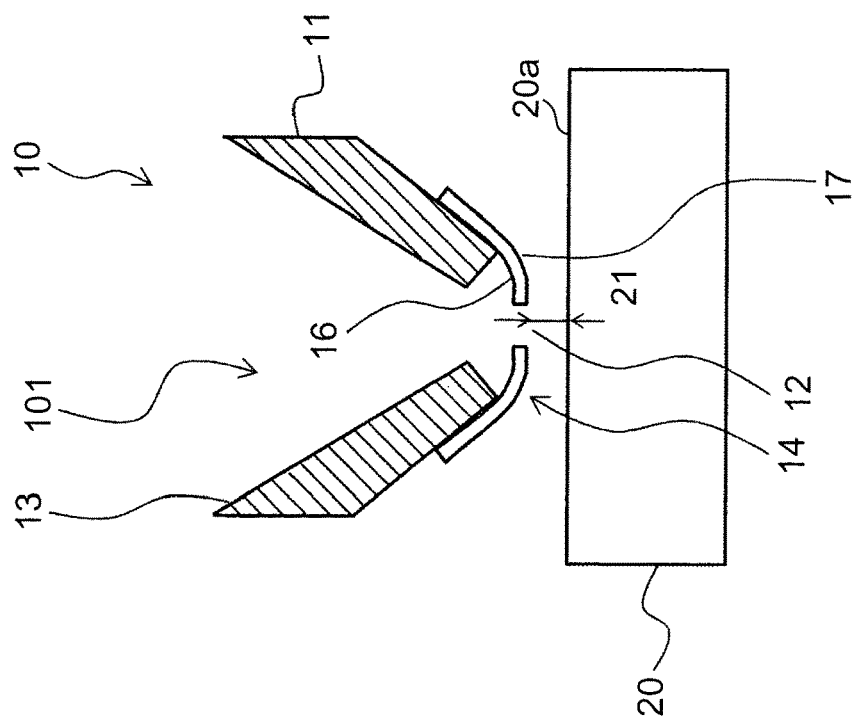
Figure 9:
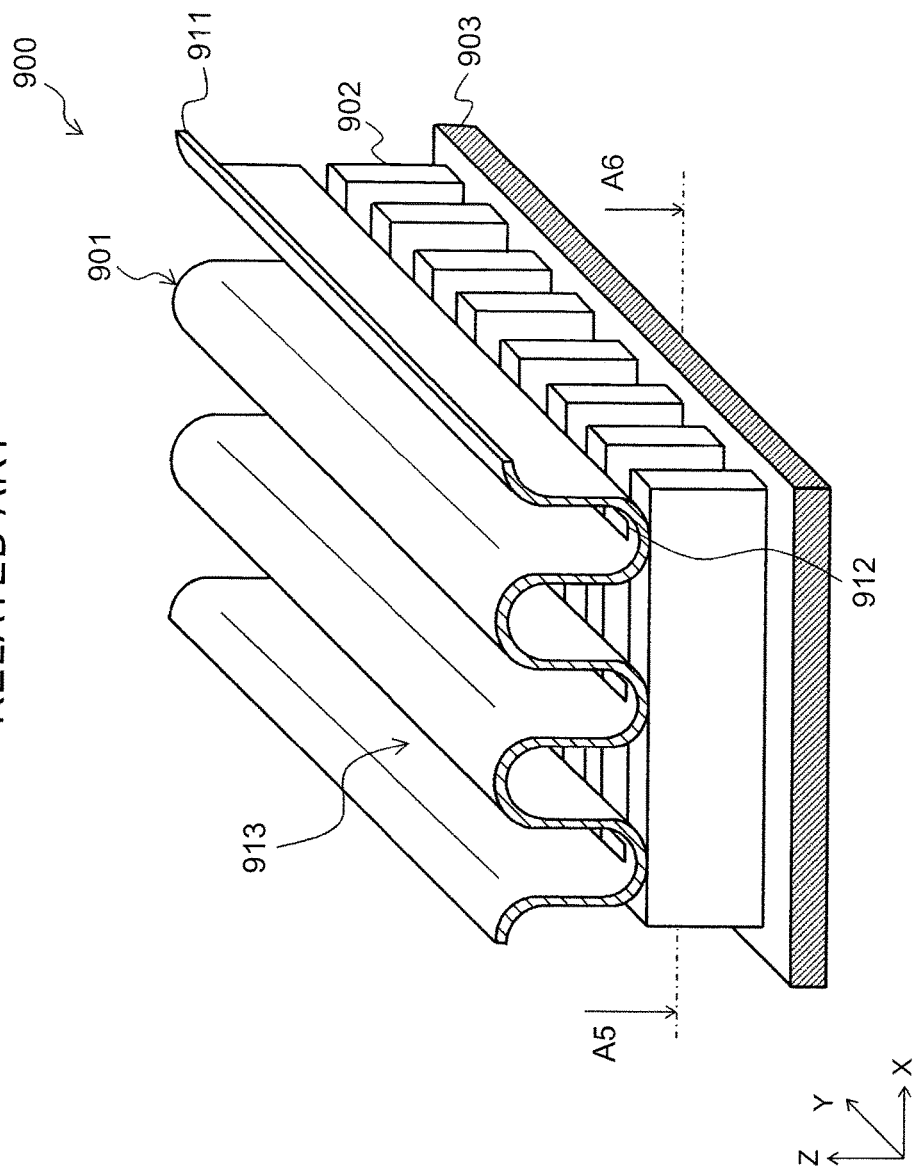
FIG. 9 is a perspective view showing a configuration of a cooler according to the related art.

FIGS. 6A and 6B are enlarged cross-sectional views of a vicinity of each of nozzle tip ends of a cooler according to Embodiment 3. FIG. 6A shows a state of the nozzle 10 before the coolant is flown therethrough, and FIG. 6B shows a state of the nozzle 10 when the coolant is flown therethrough.

In Embodiments 1 and 2, the nozzle tip end and the nozzle member are made of the single material integrally with each other. Meanwhile, in Embodiment 3, the nozzle tip end 14 is formed of a tip end member 17 separate from the nozzle member 11. In particular, rigidity of a material of the tip end member 17 is set lower than that of a material of the nozzle member 11. For example, the nozzle member 11 is made of resin, and the tip end member 17 is made of rubber. The resin is PPS or the like, and the rubber is nitrile or silicon rubber or the like. The tip end member 17 may be pasted onto the nozzle member 11 by thermocompression bonding or the like. Furthermore, an inflow passage 101-side surface of the nozzle tip end 14, which is located in the vicinity of the coolant supply hole 12, serves as the pressure receiving portion 16. In this embodiment, an inflow passage 101 side of the tip end member 17 serves as the pressure receiving portion 16.

When the coolant is flown in this state, then as shown in FIG. 6B, force to eject the coolant from the coolant supply hole 12 is applied to the pressure receiving portion 16 of the nozzle tip end 14 (P1 in FIG. 6B). Since this pressure receiving portion 16 is the low-rigidity tip end member 17, the nozzle tip end 14 is pressed and deformed (displaced) in response to the force to, eject the coolant (that is, reaction force of the jet). Then, the nozzle tip end 14 comes close to the fin 20, and intimately contacts the ejection target surface 20a of the fin 20. Then, the coolant is ejected without leaking as shown by arrows F10 in FIG. 6B.

In Embodiment 3, the tip end member made of the low-rigidity material is used as the nozzle tip end, whereby the nozzle tip end and the fin end come close to each other and intimately contact each other in a similar way to Embodiment 1, and accordingly, the cooling performance can be enhanced. Moreover, the nozzle tip end is made of the material (member) separate from that of the nozzle member, and accordingly, the nozzle tip end can be given desired rigidity and shape by an arbitrary material without changing the thickness and shape of the nozzle member.

Next, Embodiment 4 is described. Embodiment 4 is an example where nozzles thereof are different from those of the coolers according to Embodiments 1 to 3, and particularly different from those, of the cooler according to Embodiment 3. Embodiment 4 is similar to Embodiments 1 to 3 except the configuration of the nozzles.

FIGS. 7A, 7B and 7C are enlarged cross-sectional views of a vicinity of each of nozzle tip ends of the cooler according to Embodiment 4. FIG. 7A shows a state, of the nozzle 10 before the coolant is flown therethrough, FIG. 7B shows a state of the nozzle 10 when the coolant is flown therethrough, and FIG. 7C shows a pressure receiving member when the coolant is ejected.

In Embodiment 3, the nozzle tip end 14 is formed of the tip end member 17. Meanwhile, in this embodiment, a pressure receiving member 18 (second tip end member) that serves as the pressure receiving portion 16 is further provided in a region (tip end peripheral portion) between an opening portion of the coolant supply hole 12 and the tip end member 17 (first tip end member). In a similar way to Embodiment 3, the nozzle member 11 is made of resin, and the tip end member 17 is made of rubber. Moreover, the pressure receiving member 18 is made of resin or metal. For example, the resin is PPS or the like, and the metal is aluminum, SUS (stainless steel) or the like. The pressure receiving member 18 has a concave curved surface, which receives the ejected coolant, on an inflow passage 101 side thereof, and on the fin 20 side, has a bottom surface, which extends along the ejection target surfaces 20a of the fins 20.

When the coolant is flown in this state, then as shown in FIG. 7B, force to eject the coolant from the coolant supply hole 12 is applied to the pressure receiving member 18 of the nozzle tip end 14 (P1 in FIG. 7B). Since the low-rigidity tip end member 17 is provided between this pressure receiving member 18 and the nozzle member 11, the tip end member 17 is pressed and deformed (displaced) in response to the force to eject the coolant (that is, reaction force of the jet). Then, the pressure receiving member 18 of the nozzle tip end 14 comes close to the fin 20, and intimately contacts the ejection target surface 20a of the fin 20. Then, the coolant is ejected without leaking as shown by arrows F10 in FIG. 7B.

As shown in FIG. 7C, the pressure receiving member 18 of the nozzle tip end is formed into such a shape in which the jet is received on a concave surface, whereby it is made easy for the pressure receiving member 18 to receive the force of the jet, and pressing force (P2 in FIG. 7C) thereof is strengthened, and accordingly, adhesion thereof onto the fin end is enhanced.

In Embodiment 4, the tip end member made of the low-rigidity material is used as the nozzle tip end, whereby the cooling performance can be enhanced in a similar, way to Embodiment 3, and further, the pressure receiving member that receives the jet on the concave surface is provided, whereby the cooling performance can be enhanced.

Next, Embodiment 5 is described. In Embodiment 5, a description is made of an example of adopting a layered structure for the cooler according to each of Embodiments 1 to 4. An internal configuration of a cooler in Embodiment 5 is similar to those in Embodiments 1 to 4.

FIG. 8 is an exploded perspective view of such a layered cooler according to Embodiment 5. As shown in FIG. 8, the layered cooler 200 according to this embodiment includes: two cooling plates 210; and a power card 220. The power card 220 is arranged in a layered manner between the two cooling plates 210, and the power card 220 is cooled from both surfaces thereof by the two cooling plates 210. Note that a plurality of the cooling plates 210 and a plurality of the power cards 220 may be further layered.

The power card 220 is a card-like power module in which semiconductor devices are molded by resin. An internal structure of the cooling plate 210 is similar to those in Embodiments 1 to 5. Each of the cooling plates 210 includes: a coolant supply header 211 that supplies the coolant; and a coolant discharge header 212 that discharges the coolant.

When the coolant is supplied to the coolant supply headers 211 in a state where the cooling plates 210 and the power card 220 are layered with each other, then in a similar way to FIGS. 1A, 1B and 1C and the like, the supplied coolant is ejected from the nozzles 10 through fin spaces to the base plate 31, cooling surfaces 31b are cooled, and the coolant is discharged from the coolant discharge headers 212. In FIG. 8, both surfaces of the power card 220 are cooled by the cooling surfaces 31b of the two cooling plates 210.

As described above, by the layered cooler, the power module such as the power card can be cooled effectively from both surfaces thereof. In particular, the coolers according to Embodiments 1 to 4 are applied, whereby cooling performance of the layered cooler can be enhanced.

The invention claimed is:
1. A cooler, comprising:
   a heat transfer member having a coolant inflow port into which coolant flows; and
   a nozzle configured to eject a supplied coolant toward the coolant inflow port, the nozzle including a flow passage wall, a tip end, a pressure receiving portion and a deformation portion, the flow passage wall including a flow passage for the supplied coolant, the tip end including an ejection port that ejects the coolant flowing through the flow passage, the pressure receiving portion being configured to receive force in an ejection direction of the coolant, the pressure receiving portion being provided between the flow passage wall and the ejection port, the deformation portion being configured to displace the ejection port in the ejection direction of the coolant in response to the force in the ejection direction of the coolant, the force being received by the pressure receiving portion, and the deformation portion being provided either between the flow passage wall and the pressure receiving portion or in the pressure receiving portion,
   wherein the pressure receiving portion has a concave curved surface that receives the ejected coolant, and
   wherein the deformation portion is configured to have the tip end contact the heat transfer member in response to the force being received by the pressure receiving portion.
2. The cooler according to claim 1, wherein
   rigidity of the deformation portion is lower than rigidity of the flow passage wall.
3. The cooler according to claim 2, wherein
   a thickness of the deformation portion is thinner than a thickness of the flow passage wall.
4. The cooler according to claim 2, wherein
   the deformation portion is made of a material lower in rigidity than the flow passage wall.
5. The cooler according to claim 1, wherein
   a thin portion that is locally thin is provided in the tip end.
6. The cooler according to claim 5, wherein
   a plurality of the thin portions are provided.
7. The cooler according to claim 1, wherein
   the pressure receiving portion has an inclined surface inclined such that a width of a vicinity of the ejection port is narrow from the flow passage wall toward the ejection port.
8. The cooler according to claim 1, wherein
   the nozzle includes a tip end member on a peripheral portion of the ejection port, the tip end member serving as a second tip end having the concave curved surface that receives the ejected coolant.
9. The cooler according to claim 1, wherein
   a peripheral portion of the ejection port extends along a surface of the heat transfer member, the surface being opposite to the ejection port.
10. The cooler according to claim 1, wherein
   the heat transfer member having the coolant inflow port is a radiating fin that cools a cooling target.

* * * * *